United States Patent
Lee

(10) Patent No.: US 7,474,122 B2
(45) Date of Patent: Jan. 6, 2009

(54) HIGH-PERFORMANCE STATIC PROGRAMMABLE LOGIC ARRAY

(75) Inventor: Dong-gyu Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/668,266

(22) Filed: Jan. 29, 2007

(65) Prior Publication Data
US 2007/0194808 A1 Aug. 23, 2007

(30) Foreign Application Priority Data
Feb. 21, 2006 (KR) .............. 10-2006-0016684

(51) Int. Cl.
*H03K 19/177* (2006.01)
(52) U.S. Cl. .............................. 326/41; 326/39; 326/95
(58) Field of Classification Search ............... 326/39, 326/41, 93, 95; 365/203
See application file for complete search history.

(56) References Cited
U.S. PATENT DOCUMENTS
4,782,249 A 11/1988 Engeler et al.
6,222,383 B1 * 4/2001 Murata et al. .............. 326/44

FOREIGN PATENT DOCUMENTS
| JP | 53-143139 | 12/1978 |
| JP | 60-176329 | 9/1985 |
| JP | 03-060522 | 3/1991 |
| JP | 05-235747 | 9/1993 |

OTHER PUBLICATIONS
Office Action Dated Apr. 29, 2008 From Korean Patent Office in Connection With Corresponding Korean Application No. 10-2006-0016684.

* cited by examiner

*Primary Examiner*—Daniel D Chang
(74) *Attorney, Agent, or Firm*—F. Chau & Assoc., LLC

(57) ABSTRACT

A high-performance programmable logic array (PLA) includes an AND plane that is initialized when a reset signal is activated and that evaluates a plurality of input signals when the reset signal is inactivated; and or OR plane that receives output signals of the AND plane, that is disabled when one of the output signals is activated, and that evaluates the rest of the output signals of the AND plane to output a final result signal when the one of the output signals of the AND plane is inactivated. The PLA uses a reset signal as a driving signal, instead of a clock signal. Accordingly, it is possible to realize a PLA with both low power consumption and high operation speed.

13 Claims, 3 Drawing Sheets

HIGH-PERFORMANCE STATIC PROGRAMMABLE LOGIC ARRAY

CROSS-REFERENCE TO RELATED PATENT APPLICATION

This application claims the benefit of Korean Patent Application No. 10-2006-0016684, filed on Feb. 21, 2006, in the Korean Intellectual Property Office, the disclosure of which is incorporated herein in its entirety by reference.

BACKGROUND OF THE INVENTION

1. Technical Field

The present disclosure relates to a programmable logic array (PLA), and more particularly, to a high-performance static PLA.

2. Discussion of the Related Art

A programmable logic array (PLA) is generally used in an instruction decoder block of a processor or a control block of a finite state machine (FSM), which is typically complex, in order to increase an operation speed or reduce a chip area. The PLA generally includes an AND plane and an OR plane, which are connected to each other in series.

The PLA is classified into two types: a dynamic PLA and a static PLA. An example of the dynamic PLA is disclosed in U.S. Pat. No. 4,894,564, and an example of the static PLA is disclosed in U.S. Pat. No. 4,728,827. In general, while the dynamic PLA has a high operation speed, it has a high power consumption and a large amount of noise because the dynamic PLA is operated in synchronization with a clock signal having a short duration. In contrast, the static PLA has a low power consumption, but also has a low operation speed.

SUMMARY OF THE INVENTION

Accordingly, exemplary embodiments of the present invention provide a high-performance static programmable logic array (PLA) having a high operation speed and a low power consumption.

According to an exemplary embodiment of the present invention, there is provided a programmable logic array including an AND plane that is initialized when a reset signal is activated and that evaluates a plurality of input signals when the reset signal is inactivated; and an OR plane that receives a plurality of output signals of the AND plane, that is disabled when one of the output signals of the AND plane is activated, and that evaluates the rest of the output signals of the AND plane to output a final result signal when one of the output signals of the AND plane is inactivated.

The AND plane may include a plurality of product term lines that are selected by selection input signals, that are disabled when the reset signal is activated, and that evaluate the plurality of input signals to output the output signals when the reset signal is inactivated.

Each of the product term lines may include an AND plane evaluating circuit and a plurality of pull-down transistors. The AND plane evaluating circuit can receive a result signal obtained by a logic operation between each of the selection input signals and the reset signal, can initialize an output signal of an output line when the result signal is in a first logic state, and can evaluate states of the input signals when the result signal is in a second logic state. The plurality of pull-down transistors can be connected in parallel to the output line of the AND plane evaluating circuit and can be controlled by the input signals, respectively.

The OR plane can include an OR plane evaluating circuit, a plurality of pull-down transistors, and an inverter. The OR plane evaluating circuit can receive the one of the output signals of the AND plane, can disable a signal of an output port of the OR plane evaluating circuit when the one of the output signals of the AND plane is inactivated, and can evaluate the states of the other output signals when the one of the output signals is inactivated. The plurality of pull-down transistors can be connected to the output port of the OR plane evaluating circuit in parallel and can be controlled by the other output signals of the AND plane, respectively. The inverter can invert the signal of the output port of the OR plane evaluating circuit to output the final result signal.

BRIEF DESCRIPTION OF THE DRAWINGS

Exemplary embodiments of the present invention will be understood in more detail from the following descriptions taken in conjunction with the attached drawings in which.

DETAILED DESCRIPTION OF EXEMPLARY EMBODIMENTS

The attached drawings illustrating exemplary embodiments of the present invention are referred to in order to gain a sufficient understanding of the present invention, the merits thereof, and the objectives accomplished by the implementation of the present invention.

Figure 1:
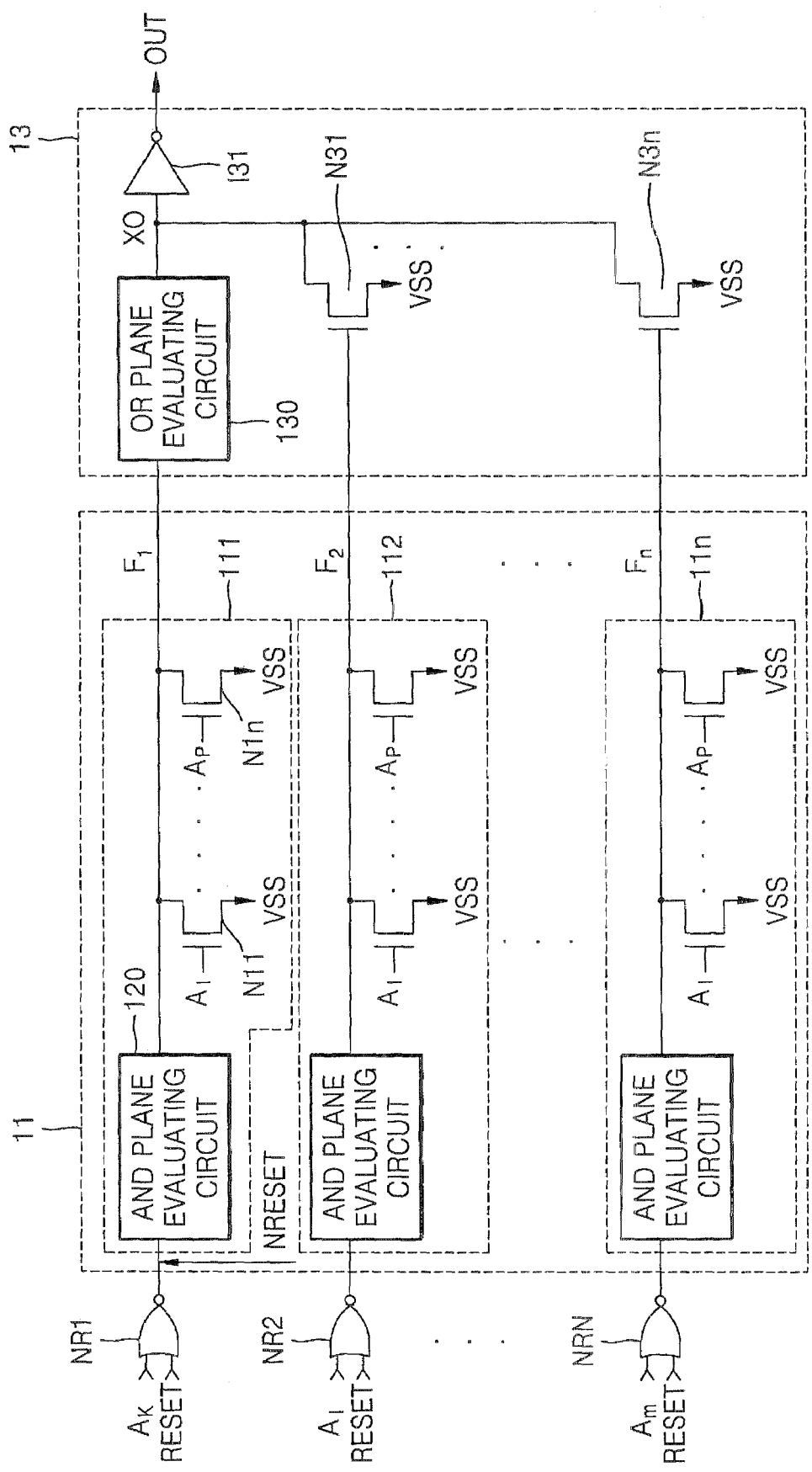
FIG. 1 illustrates a block diagram of a high-performance static programmable logic array (PLA) according to an exemplary embodiment of the present invention.

Hereinafter, the present invention will be described in detail by explaining exemplary embodiments of the invention with reference to the attached drawings. Like reference numerals in the drawings denote like elements. FIG. 1 is a block diagram of a high-performance static programmable logic array (PLA) according to an exemplary embodiment of the present invention.

Referring to FIG. 1, the PLA according to the exemplary embodiment of the present invention includes an AND plane 11 and an OR plane 13.

The PLA according to the exemplary embodiment of the present invention uses a reset signal RESET instead of a clock signal. The AND plane 11 is initialized when the reset signal RESET is activated (logic high), and evaluates a plurality of input signals $A_1$ to $A_P$ when the reset signal RESET is inactivated (logic low). The activation of the reset signal RESET indicates a reset state and the inactivation of the reset signal RESET indicates a reset release state.

The OR plane 13 receives output signals $F_1$ to $F_n$ of the AND plane 11, is disabled when an output signal $F_1$ is activated (logic high), and evaluates the other output signals $F_2$ to $F_n$ to output a final result signal OUT when the output signal $F_1$ is inactivated (logic low).

The AND plane 11 includes a plurality of product term lines 111 to 11n. The product term lines 111 to 11n are selected by selection input signals $A_k$ to $A_m$, respectively. The product term lines 111 to 11n are disabled when the reset signal RESET is activated and input signals $A_1$ to $A_P$ are evaluated to output the output signals $F_1$ to $F_n$ when the reset signal RESET is inactivated.

More specifically, each of the product term lines 111 to 11n includes an AND plane evaluating circuit 120 and a plurality of pull-down transistors N11 to N1n. The AND plane evaluating circuit 120 receives a result signal NRESET obtained by a NOR operation between each of the selection input signals $A_k$ to $A_m$ and the reset signal RESET through each of NOR gates NR1 to NRn.

The AND plane evaluating circuit 120 initializes the output signal $F_1$ based on a logic low state of the result signal NRESET, that is, when the reset signal RESET is activated to a logic high level, and evaluates a state of each of the input signals $A_1$ to $A_P$ in a logic high state of the result signal NRESET, that is, when the reset signal RESET is inactivated to a logic low level. The detailed configuration and operation of the AND plane evaluating circuit 120 will be described below with respect to FIGS. 2 and 4.

The pull-down transistors N11 to N1n are connected to an output line of the AND plane evaluating circuit 120 in parallel and controlled by the input signals $A_1$ to $A_P$, respectively. The pull-down transistors N11 to N1n set the output line of the AND plane evaluating circuit 120 to a logic low level in response to the input signals $A_1$ to $A_P$, respectively.

The OR plane 13 includes an OR plane evaluating circuit 130, a plurality of pull-down transistors N31 to N3n, and an inverter 131. The OR plane evaluating circuit 130 receives the output signal $F_1$ of the AND plane 11, disables a signal of an output port XO when the output signal $F_1$ is activated (logic high) and evaluates the states of the output signals $F_2$ to $F_n$ when the output signal $F_1$ is inactivated (logic low). The detailed configuration of the OR plane evaluating circuit 130 will be described below with reference to FIG. 3.

The pull-down transistors N31 to N3n are connected to the output port of the OR plane evaluating circuit 130 in parallel and controlled by the output signals $F_2$ to $F_n$, respectively. The pull-down transistors N31 to N3n set the output port of the OR plane evaluating circuit 130 to a logic low level in response to the output signals $F_2$ to $F_n$, respectively.

The inverter 131 inverts the signal of the output port XO of the OR plane evaluating circuit 130 and outputs the final result signal OUT.

Figure 2:
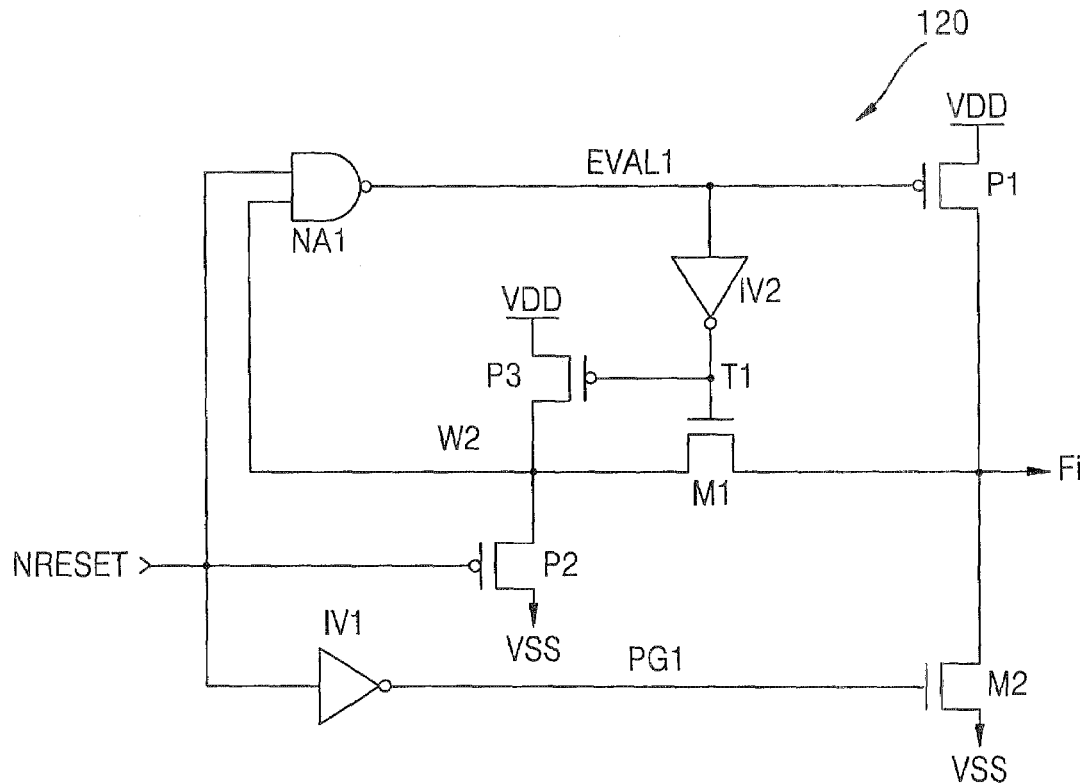
FIG. 2 illustrates a detailed circuit diagram of an AND plane evaluating circuit illustrated in FIG. 1, according to an exemplary embodiment of the present invention.

FIG. 2 illustrates a detailed circuit diagram of the AND plane evaluating circuit 120 shown in FIG. 1, according to an exemplary embodiment of the present invention.

Referring to FIG. 2, the AND plane evaluating circuit 120 includes a first inverter IV1, a second inverter IV2, a NAND gate NA1, and MOS transistors P1, P2, P3, M1, and M2.

In the exemplary embodiment of the present invention, MOS transistors P1, P2, and P3 are PMOS transistors and MOS transistors M1 and M2 are NMOS transistors.

The first inverter IV1 inverts the result signal NRESET obtained by the NOR operation between each of the selection input signals $A_k$ to $A_m$ and the reset signal RESET. The NAND gate NA1 performs a NAND operation between the result signal NRESET and a signal at an internal node W2, and the second inverter IV2 inverts an output signal EVAL1 of the NAND gate NA1.

The PMOS transistor P1 is connected between a first power supply voltage, that is, a power supply voltage VDD, and an output line Fi, and is controlled by the output signal EVAL1 of the NAND gate NA1. The NMOS transistor M2 is connected between a second power supply source voltage, that is, a ground voltage VSS, and the output line Fi and is controlled by an output signal PG1 of the first inverter IV1. The NMOS transistor M1 is connected between the internal node W2 and the output line Fi and is controlled by an output signal T1 of the second inverter IV2.

The PMOS transistor P3 is connected between the power supply voltage VDD and the internal node W2 and is controlled by the output signal T1 of the second inverter IV2. The PMOS transistor P2 is connected between the power supply voltage VSS and the internal node W2 and is controlled by the result signal NRESET.

Figure 3:
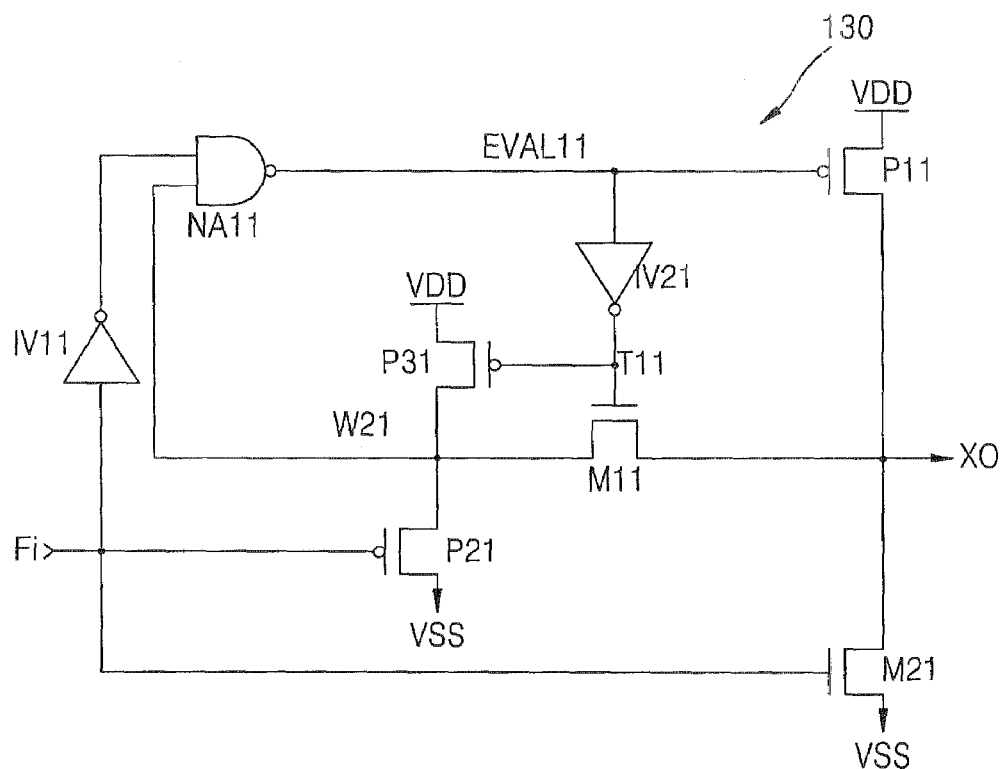
FIG. 3 illustrates a detailed circuit diagram of an OR plane evaluating circuit illustrated in FIG. 1, according to an exemplary embodiment of the present invention.

FIG. 3 illustrates a detailed circuit diagram of the OR plane evaluating circuit 130 shown in FIG. 1, according to an exemplary embodiment of the present invention.

Referring to FIG. 3, the OR plane evaluating circuit 130 includes a first inverter IV11, a second inverter IV21, a NAND gate NA11, MOS transistors P11, P21, and P31, and MOS transistors M11 and M21.

In the exemplary embodiment of the present invention, MOS transistors P11, P21, and P31 are PMOS transistors and MOS transistors M11 and M21 are NMOS transistors. The inverter IV11 receives and inverts the output signal Fi of the AND plane evaluating circuit 120. The NAND gate NA11 performs a NAND operation between an output signal of the inverter IV11 and a signal of an internal node W21, and the inverter IV21 inverts an output signal EVAL11 of the NAND gate NA11.

The PMOS transistor P11 is connected between the first power supply source voltage, that is, the power supply voltage VDD, and the output port XO and is controlled by the output signal EVAL11 of the NAND gate NA11. The NMOS transistor M21 is connected between the second power supply source voltage, that is, the ground voltage VSS, and the output port XO and is controlled by the output signal Fi of the AND plane evaluating circuit 120. The NMOS transistor M11 is connected between the internal node W21 and the output port XO, and controlled by an output signal T11 of the inverter IV21.

The PMOS transistor P31 is connected between the power supply voltage VDD and the internal node W21 and is controlled by the output signal T11 of the inverter IV21. The PMOS transistor P2 is connected between the power supply voltage VSS and the internal node W21 and is controlled by the output signal Fi of the AND plane evaluating circuit 120.

Figure 4:
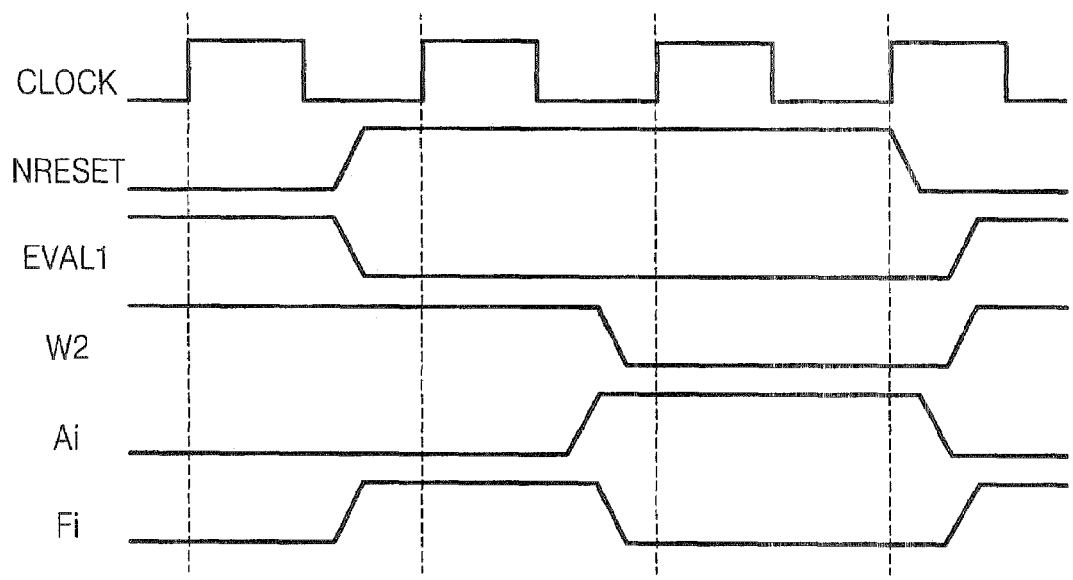
FIG. 4 illustrates an operation timing diagram of the AND plane evaluating circuit in FIG. 2.

FIG. 4 illustrates an operation timing diagram of the AND plane evaluating circuit 120 shown in FIG. 2.

First, when the reset signal RESET is activated to the logic high level (at this time, it is assumed that the selection input signal $A_k$ shown in FIG. 1 is at a logic low level), the result signal NRESET, which is obtained by the NOR operation between the selection input signal $A_k$ and the reset signal RESET, is in the logic low level. Accordingly, the output signal EVAL1 of the NAND gate NA1 is in the logic high level and, thus, the PMOS transistor P1 is turned off.

The output signal T1 of the inverter IV2 is at the logic low level, the PMOS transistor P3 is turned on, and the internal node W2 is pre-charged to the logic high level. At this time, the NMOS transistor M1 is turned off by the signal T1 at the logic low level. Since the output signal PG1 of the inverter IV1 is at the logic high level, the NMOS transistor M2 is turned on, and thus, the output line Fi is set to the logic low level.

When the reset signal RESET is inactivated to the logic low level (at this time, it is assumed that the selection input signal $A_k$ shown in FIG. 1 is at a logic low level), the result signal NRESET, which is obtained by the NOR operation between the selection input signal $A_k$ and the reset signal RESET, is at the logic high level. At this time, since the internal node W2 is pre-charged to the logic high level, the output signal EVAL1 of the NAND gate NA1 is at the logic low level and thus, the PMOS transistor P1 is turned on. As a result, the output line Fi is at the logic high level.

At this time, the PMOS transistor P2 is turned off. Since the output signal T1 of the inverter IV2 is at the logic high level and the output signal PG1 of the inverter IV1 is at the logic low level, the PMOS transistor P3 and the NMOS transistor M2 are turned off and the NMOS transistor M1 is turned on.

At this state, when at least one of the input signals $A_1$ to $A_p$ (see FIG. 1) is applied to the pull-down transistors N11 to N1$n$ connected to the output line Fi of the AND plane evaluating circuit 120 and is at the logic high level, the output line Fi is set to the logic low level. Accordingly, the NMOS transistor M1 is turned on and the internal node W2 is at the logic low level. As a result, the output signal EVAL1 of the NAND gate NA1 is at the logic high level again.

When all the input signals $A_I$ to $A_P$ are applied to the pull-down transistors N11 to N1$n$ and are at the logic low level, all the pull-down transistors N11 to N1$n$ are turned off and the output line Fi is maintained constant at the logic high level.

As described above, the AND plane evaluating circuit 120 initializes the output line Fi and sets the output line Fi to the logic low level based on the logic low state of the result signal NRESET, that is, when the reset signal RESET is activated to the logic high level, and evaluates the states of the input signals $A_I$ to $A_P$ in the logic high state of the result signal NRESET, that is, when the reset signal RESET is inactivated to the logic low level.

Figure 5:
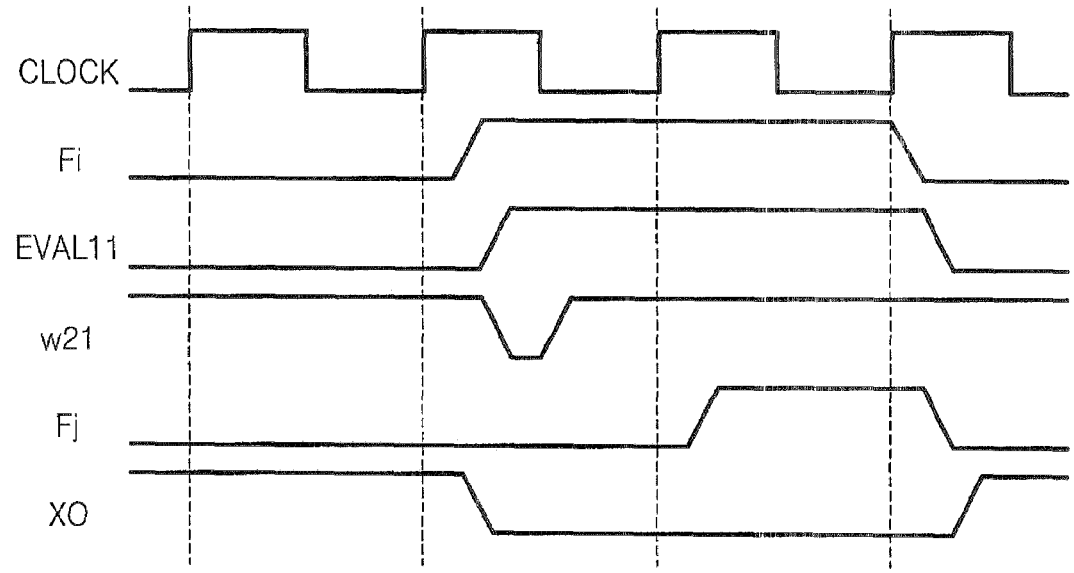
FIG. 5 illustrates an operation timing diagram of the OR plane evaluating circuit in FIG. 3.

FIG. 5 illustrates an operation timing diagram of the OR plane evaluating circuit 130 of FIG. 3. A signal Fi shown in FIG. 5 denotes one of the signals $F_2$ to $F_n$ (see FIG. 1) applied to the pull-down transistors N31 to N3$n$ connected to the output port XO of the OR plane evaluating circuit 130. The operation of the OR plane evaluating circuit 130 is substantially the same as that of the AND plane evaluating circuit 120 and, thus, a detailed description of the operation of the OR plane evaluating circuit 130 will be omitted.

As described above, the PLA according to exemplary embodiments of the present invention uses the reset signal RESET as a driving signal, instead of a clock signal having a low period or a high frequency. Accordingly, it is possible to realize a PLA with both low power consumption and high-speed operation. In addition, when the reset signal RESET is activated (reset state), the PLA according to exemplary embodiments of the present invention is held in a disabled state (initialized state) and, thus, the power consumption of the PLA due to current leakage is minimal. When the reset signal RESET is inactivated (reset release state), the PLA according to the present invention is operated depending on the selection of the input signals $A_k$ to $A_m$.

As described above, according to the PLA provided by an exemplary embodiment of the present invention, it is possible to realize a PLA with both low power consumption and high operation speed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A programmable logic array comprising:
    an AND plane that is initialized when a reset signal is activated and that evaluates a plurality of input signals when the reset signal is inactivated and that produces a plurality of output signals; and
    an OR plane that receives the plurality of output signals of the AND plane, that is disabled when one of the output signals of the AND plane is activate, and that evaluates a remainder of the output signals of the AND plane in order to output a final result signal when the one of the output signals of the AND plane is inactivated,
    wherein the AND plane comprises a plurality of product term lines that are respectively selected by selection input signals, that are disabled when reset signal is activated, and that evaluate the plurality of input signals to output the plurality of output signals when the reset signal is inactivated.

2. The programmable logic array of claim 1, wherein each of the product term lines comprises
    an AND plane evaluating circuit that receives a result signal obtain A by logic operation between each of the selection input signals and the reset signal, that initializes an output signal of an output line when the result signal is in a first logic state, and that evaluates states of the plurality of input signals when the result signal is in a second logic state; and
    a plurality of pull-down transistors that are connected in parallel to the output line of the AND plane evaluating circuit and that are controlled by the input signals, respectively.

3. The programmable logic array of claim 2, wherein the AND plane evaluating circuit comprises
    a first inverter that inverts the result signal obtained by the logic operation;
    a NAND gate that performs a NAND operation between the result signal obtained by the logic operation and a signal of an internal node;
    a second inverter that inverts an output signal of the NAND gate;
    a first MOS transistor that is connected between a first power supply source voltage and the output line of the AND plane, and that is controlled by the output signal of the NAND gate;
    a second MOS transistor that is connected between a second power supply source voltage and the output line of the AND plane and that is controlled by an output signal of the first inverter;
    a third MOS transistor that is connected between the internal node and the output line of the AND plane and that is controlled by an output signal of the second inverter;
    a fourth MOS transistor that is connected between the first power supply source voltage and the internal node and that is controlled by the output signal of the second inverter; and
    a fifth MOS transistor that is connected between the second power supply source voltage and the internal node and that is controlled by the result signal obtained by the logic operation.

4. The programmable logic array of claim 3, wherein the first power supply source voltage supplies a power supply voltage and the second power supply source voltage is a ground voltage.

5. The programmable logic array of claim 3, wherein the first, fourth, and fifth MOS transistors are PMOS transistors.

6. The programmable logic array of claim 3, wherein the second and third MOS transistors are NMOS transistors.

7. The programmable logic array of claim 2, wherein each of the plurality of pull-down transistors sets the respective output line of the AND plane to a logic low level in response to each of the plurality of input signals.

8. The programmable logic array of claim 1, wherein An the OR plane comprises an OR plane evaluating circuit that receives one of the output signals of the AND plane, that disables a signal of an output port of the OR plane evaluating circuit when the one of the plurality of output signals of the AND plane is activated, and that evaluates the states of the remainder of the plurality of output signals when the one of the output signals is inactivated;

a plurality of pull-down transistors that are connected in parallel to the output port of the OR plane evaluating circuit and that are controlled by the remainder of the plurality of output signals of the AND plane, respectively; and an inverter that inverts the signal of the output port of the OR plane evaluating circuit to output the final result signal.

9. The programmable logic array of claim 8, wherein the OR plane evaluating circuit comprises a first inverter that inverts the one of the output signals of the AND plain;

a NAND gate that performs a NAND operation between an output signal of the first inverter and a signal of an internal node;

a second inverter that inverts an output signal of the NAND gate;

a first MOS transistor that is connected between a first power supply source voltage and the output port of the OR plane evaluating circuit and that is controlled by the output signal of the NAND gate;

a second MOS transistor that is connected between a second power supply source voltage and the output port of the OR plane evaluating circuit and that is controlled by the one of the output signals of the AND plane;

a third MOS transistor that is connected between the internal node and the output port of the OR plane evaluating circuit and that is controlled by an output signal of the second inverter;

a fourth MOS transistor that is connected between the first power supply source and the internal node and that is controlled by the output signal of the second inverter; and a fifth MOS transistor that is connected between the second power supply source voltage and the internal node and that is controlled by the one of the output signals of the AND plane.

10. The programmable logic array of claim 9, wherein the first power supply source voltage supplies a power supply voltage and the second power supply source voltage is a ground voltage.

11. The programmable logic array of claim 9, wherein the first, fourth, and fifth MOS transistors are PMOS transistors.

12. The programmable logic array of claim 9, wherein the second and third MOS transistors are NMOS transistors.

13. The programmable logic array of claim 8, wherein each of the plurality of pull-down transistors sets the output port of the OR plane evaluating circuit to a logic low level in response to each of the remainder of the plurality of output signals of the AND plane.

* * * * *